United States Patent
Ehara et al.

(10) Patent No.: US 10,811,020 B2
(45) Date of Patent: Oct. 20, 2020

(54) VOICE SIGNAL DECODING DEVICE AND VOICE SIGNAL DECODING METHOD

(71) Applicant: PANASONIC INTELLECTUAL PROPERTY MANAGEMENT CO., LTD., Osaka (JP)

(72) Inventors: Hiroyuki Ehara, Kanagawa (JP); Takuya Kawashima, Ishikawa (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 269 days.

(21) Appl. No.: 15/779,740

(22) PCT Filed: May 24, 2016

(86) PCT No.: PCT/JP2016/002509
§ 371 (c)(1),
(2) Date: May 29, 2018

(87) PCT Pub. No.: WO2017/094203
PCT Pub. Date: Jun. 8, 2017

(65) Prior Publication Data
US 2020/0152214 A1    May 14, 2020

(30) Foreign Application Priority Data
Dec. 2, 2015    (JP) .................................. 2015-235970

(51) Int. Cl.
*G10L 19/00*    (2013.01)
*G10L 19/028*    (2013.01)
*G10L 19/22*    (2013.01)

(52) U.S. Cl.
CPC ............ *G10L 19/028* (2013.01); *G10L 19/22* (2013.01)

(58) Field of Classification Search
CPC ...... G10L 19/00; G10L 19/005; G10L 19/008
See application file for complete search history.

(56) References Cited

U.S. PATENT DOCUMENTS

| 5,230,038 | A | * | 7/1993 | Fielder | G06T 9/005 |
| | | | | | 704/203 |
| 6,248,944 | B1 | * | 6/2001 | Ito | G09B 15/02 |
| | | | | | 386/280 |

(Continued)

FOREIGN PATENT DOCUMENTS

JP    2002-062897 A    2/2002

OTHER PUBLICATIONS

International Search Report, dated Aug. 9, 2016, from the Japan Patent Office (JPO) in International Patent Application No. PCT/JP2016/002509.

*Primary Examiner* — Anne L Thomas-Homescu
(74) *Attorney, Agent, or Firm* — Greenblum & Bernstein, P.L.C.

(57) ABSTRACT

A voice signal decoding device includes a first decoder, a second decoder, a signal switch, and a noise adder. The first decoder decodes first encoded data encoded by a first encoding method. The second decoder decodes second encoded data encoded by a second encoding method. The second encoded data has a narrower band than a band of the first encoded data. The signal switch switches an output signal of the first decoder and an output signal of the second decoder. The noise adder adds a noise signal to a high-frequency band in the output signal of the second decoder when the signal switch switches an output signal from the output signal of the first decoder to the output signal of the second decoder. The high-frequency band is a band where a signal component is lacking as compared with the output signal of the first decoder.

4 Claims, 5 Drawing Sheets

(56) References Cited

U.S. PATENT DOCUMENTS

| | | | |
|---|---|---|---|
| 6,732,070 B1* | 5/2004 | Rotola-Pukkila | G10L 19/0208 704/219 |
| 6,732,075 B1* | 5/2004 | Omori | G10L 19/012 704/250 |
| 7,003,451 B2* | 2/2006 | Kjorling | G10L 21/038 375/240 |
| 7,151,802 B1* | 12/2006 | Bessette | G10L 19/26 375/259 |
| 7,272,556 B1* | 9/2007 | Aguilar | G10L 19/093 704/201 |
| 9,679,577 B2* | 6/2017 | Endo | G10L 21/02 |
| 9,984,695 B2* | 5/2018 | Thesing | G10L 21/0388 |
| 10,249,313 B2* | 4/2019 | Gao | G10L 19/0204 |
| 10,269,365 B2* | 4/2019 | Fuchs | G10L 19/087 |
| 2001/0044722 A1* | 11/2001 | Gustafsson | G10L 21/038 704/258 |
| 2003/0093271 A1* | 5/2003 | Tsushima | G10L 19/0208 704/230 |
| 2004/0028244 A1* | 2/2004 | Tsushima | G10L 21/038 381/98 |
| 2005/0017879 A1* | 1/2005 | Linzmeier | H04B 1/66 341/50 |
| 2008/0103765 A1* | 5/2008 | Lakaniemi | G10L 19/22 704/222 |
| 2008/0126082 A1* | 5/2008 | Ehara | G10L 19/24 704/205 |
| 2008/0249766 A1* | 10/2008 | Ehara | G10L 19/24 704/203 |
| 2009/0024234 A1* | 1/2009 | Archibald | G11B 27/038 700/94 |
| 2010/0286805 A1* | 11/2010 | Gao | G10L 19/005 700/94 |
| 2010/0318349 A1* | 12/2010 | Kovesi | G10L 19/005 704/207 |
| 2011/0173006 A1* | 7/2011 | Nagel | G10L 19/24 704/500 |
| 2011/0257980 A1* | 10/2011 | Gao | G10L 21/038 704/500 |
| 2012/0010880 A1* | 1/2012 | Nagel | G10L 19/18 704/205 |
| 2012/0095757 A1* | 4/2012 | Gibbs | G10L 21/038 704/219 |
| 2012/0185255 A1* | 7/2012 | Virette | G10L 19/24 704/500 |
| 2012/0259642 A1* | 10/2012 | Takada | G10L 19/167 704/500 |
| 2013/0332969 A1* | 12/2013 | Stewart | G11B 27/034 725/87 |
| 2014/0142957 A1* | 5/2014 | Sung | G10L 19/0204 704/500 |
| 2014/0316789 A1* | 10/2014 | Lowe | G10L 19/26 704/500 |
| 2015/0149156 A1* | 5/2015 | Atti | G10L 19/265 704/205 |
| 2015/0187360 A1* | 7/2015 | Nagel | G10L 21/038 704/500 |
| 2016/0104490 A1* | 4/2016 | Sukowski | G10L 19/06 704/501 |
| 2016/0118056 A1* | 4/2016 | Choo | G10L 19/002 381/100 |
| 2016/0343384 A1* | 11/2016 | Ragot | G10L 19/0204 |
| 2017/0069328 A1* | 3/2017 | Kawashima | G10L 19/0204 |
| 2017/0110132 A1* | 4/2017 | Disch | G10L 19/0208 |
| 2017/0140774 A1* | 5/2017 | Hashimoto | G10L 21/0332 |
| 2018/0330739 A1* | 11/2018 | Chebiyyam | G10L 19/005 |
| 2019/0052986 A1* | 2/2019 | Lee | H04S 7/307 |
| 2019/0108844 A1* | 4/2019 | Chebiyyam | G10L 19/008 |
| 2019/0259393 A1* | 8/2019 | Grill | G10L 19/18 |
| 2019/0311723 A1* | 10/2019 | Ullmann | G10L 19/173 |

* cited by examiner

VOICE SIGNAL DECODING DEVICE AND VOICE SIGNAL DECODING METHOD

This application is a U.S. national stage application of the PCT International Application No. PCT/JP2016/002509 filed on May 24, 2016, which claims the benefit of foreign priority of Japanese patent application 2015-235970 filed on Dec. 2, 2015, the contents all of which are incorporated herein by reference.

TECHNICAL FIELD

The present disclosure relates to a voice signal decoding device and a voice signal decoding method used in a dual codec voice transmission system using different codecs.

BACKGROUND ART

Conventionally, there has been a voice transmission system in which codecs in use are switched in accordance with a state of a transmission line or the like. In such a voice transmission system, for example, when a wide-band codec can be used, the wide-band codec is used, and when the wide-band codec cannot be used, a narrow-band codec is used.

When the codecs are switched, noise and the like occurring at the time of switching need to be reduced to suppress an auditory uncomfortable feeling. As one method therefor, Patent Literature 1 discloses a technique of switching encoding means (codecs) in a silence period to prevent the occurrence of the noise accompanying the switching of the encoding means (the codecs).

CITATION LIST

Patent Literature

PTL 1: Unexamined Japanese Patent Publication No. 2002-62897

SUMMARY OF THE INVENTION

When the switching of the codecs is performed in the silence period as in PTL 1, the switching of the codecs cannot be performed until it becomes the silence period, which is practically inconvenient.

According to one aspect of the present disclosure, there are provided a voice signal decoding device and a voice signal decoding method that can suppress an auditory uncomfortable feeling at the time of codec switching.

A voice signal decoding device according to one aspect of the present disclosure includes a first decoder, a second decoder, a signal switch, and a noise adder. The first decoder decodes first encoded data encoded by a first encoding method and transmitted. The second decoder decodes second encoded data encoded by a second encoding method and transmitted. The second encoded data has a narrower band than a band of the first encoded data. The signal switch switches and outputs an output signal of the first decoder and an output signal of the second decoder. The noise adder adds a noise signal to a high-frequency band in the output signal of the second decoder when the signal switch switches the output signal from the output signal of the first decoder to the output signal of the second decoder. The high-frequency band is a band where a signal component is lacking as compared with the output signal of the first decoder.

A voice signal decoding method according to one aspect of the present disclosure includes decoding first encoded data, decoding second encoded data, switching and outputting, and adding. In the decoding the first encoded data, first encoded data encoded by a first encoding method and transmitted is decoded. In the decoding the second encoded data, second encoded data encoded by a second encoding method and transmitted is decoded. The second encoded data has a narrower band than a band of the first encoded data. In the switching and outputting, a first decoded signal obtained in the decoding the first encoded data and a second decoded signal obtained in the decoding the second encoded data are switched and outputted. In the adding, a noise signal is added to a high-frequency band in the second decoded signal when the output signal is switched from the first decoded signal to the second decoded signal in the switching. The high-frequency band is a band where a signal component is lacking as compared with the first decoded signal.

These comprehensive or specific aspects may be implemented by a system, a device, a method, an integrated circuit, a computer program, or a recording medium, or may be implemented in an arbitrary combination of the system, the device, the method, the integrated circuit, the computer program, and the recording medium.

More advantages and effects in one aspect of the present disclosure will be clarified from the specification and the drawings. The advantages and effects may be individually obtained by several exemplary embodiments and features described in the specification and drawings, which need not all be provided in order to obtain one or more of such advantages and effects.

DESCRIPTION OF EMBODIMENTS

Exemplary embodiments of the present disclosure will be described in detail below with reference to the drawings.

(1) Principle

First, a principle of the present exemplary embodiment will be described.

Figure 1:
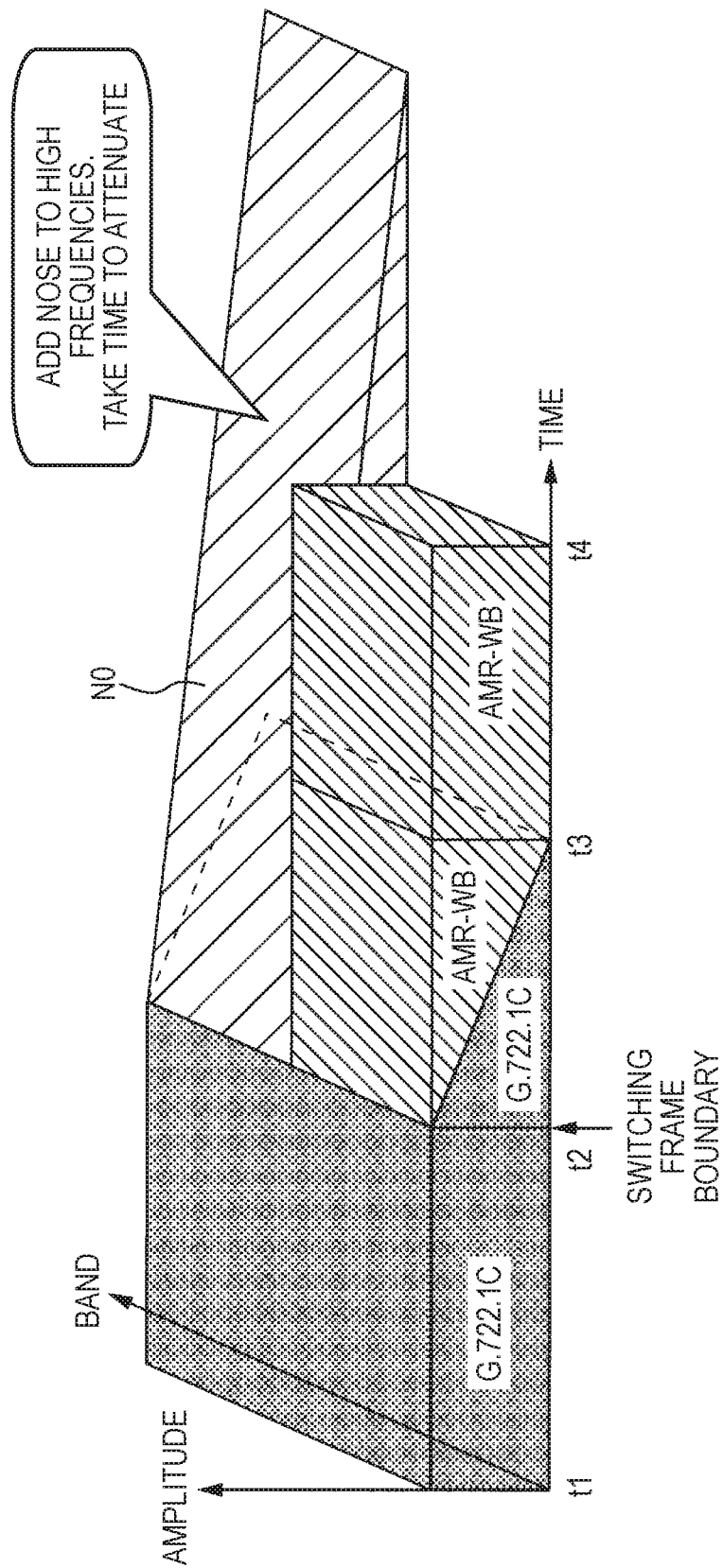
FIG. 1 is a diagram used for description of a principle of an exemplary embodiment.

FIG. 1 is a diagram showing the principle of a decoding method according to the exemplary embodiment. In FIG. 1, the principle when the switching is performed from a first codec using a first encoding method to a second codec using a second encoding method is shown. As the first codec, a codec conforming with G.722.1C is used. As the second codec, a codec conforming with AMR-WB is used. As evident from the figure, the first codec (G.722.1C) has a band wider than the second codec (AMR-WB).

When the first codec and the second codec are compared, the second codec lacks a signal component in a high-frequency band. In the decoding method of the present exemplary embodiment, noise signal NO gradually attenuating with time from a time point t2 when the codec is switched from the first codec to the second codec is added to the high-frequency band lacking the signal component. This can suppress the occurrence of abnormal sound when the codec is switched to the second codec, which lacks a high-frequency component, as compared with the first codec. As noise signal NO, for example, white noise may be used.

In addition, in the present exemplary embodiment, cross fade processing is performed. Specifically an output level of the first codec is gradually lowered and an output level of the second codec is gradually raised from the time point t2 when the codec is switched from the first codec to the second codec.

Figure 2:
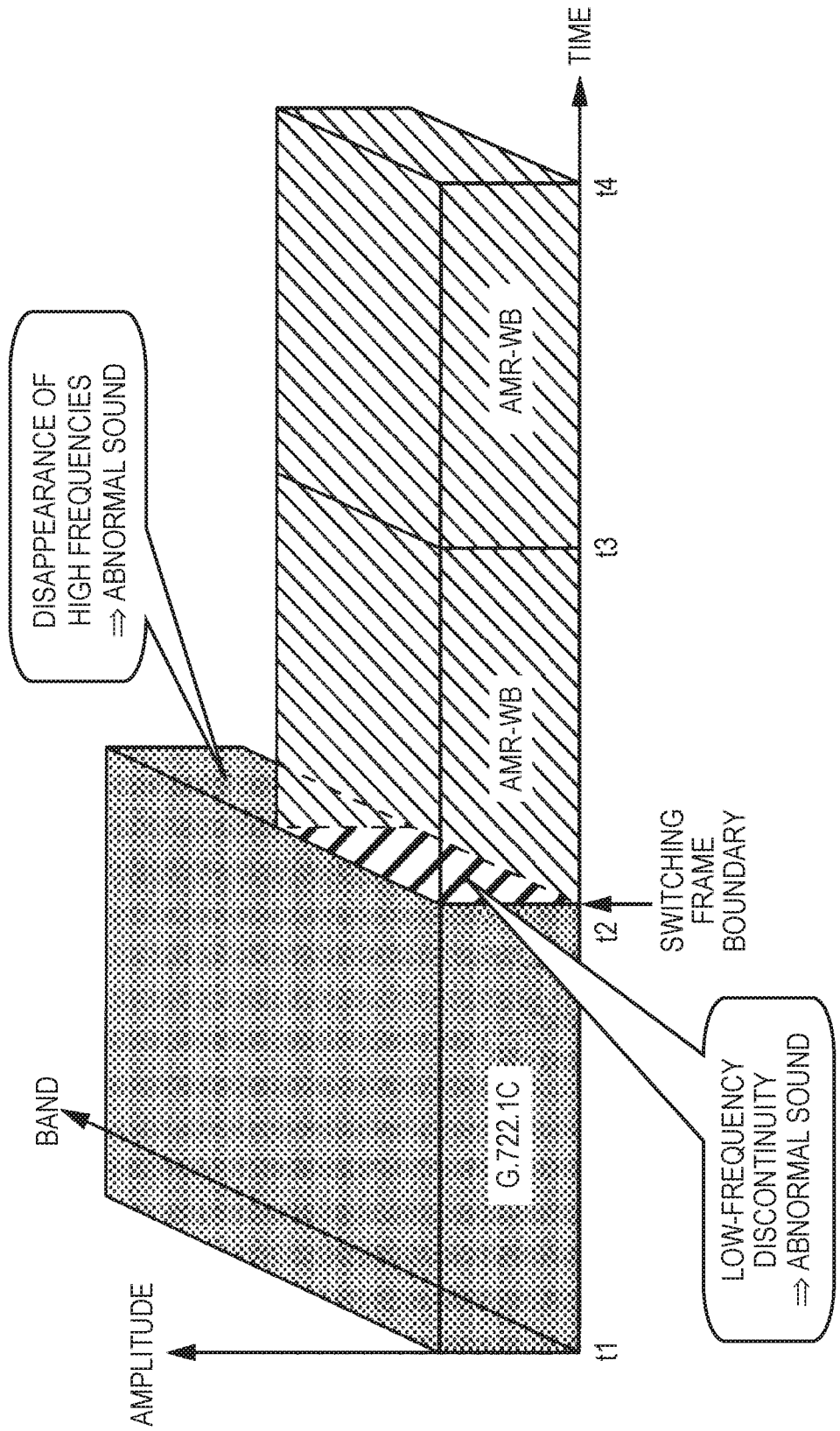
FIG. 2 is a diagram used for description of abnormal sound occurrence attributed to disappearance of a high-frequency signal and discontinuity of a low-frequency signal.

As shown in FIG. 2, if noise signal NO is not added, the signal in the high-frequency band disappears after the codec switching time point t2, so that the abnormal sound occurs at the switching time point t2. In the present exemplary embodiment, the above-described occurrence of the abnormal sound attributed to the disappearance of the signal in the high-frequency band can be suppressed.

Figure 3:
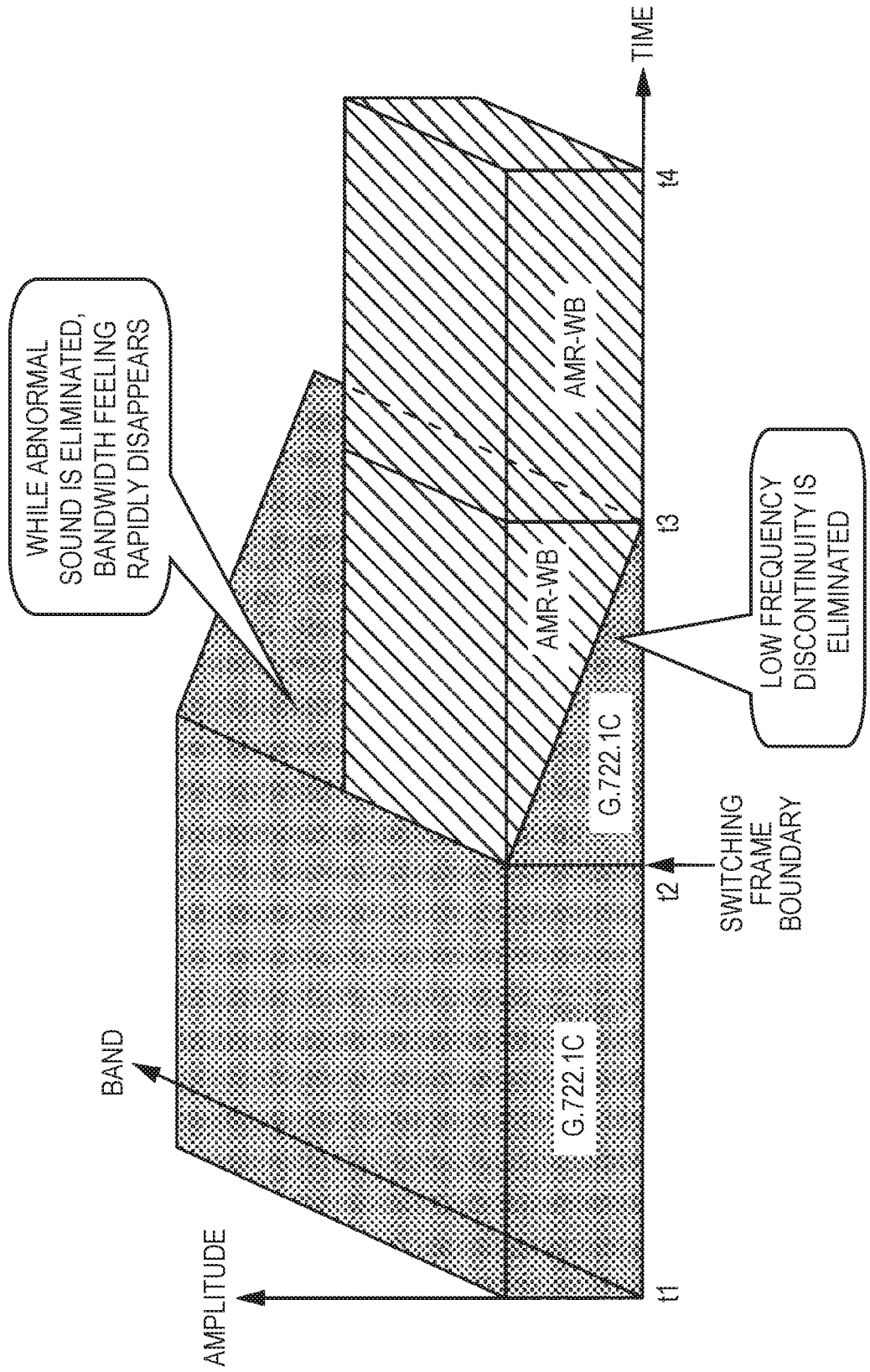
FIG. 3 is a diagram used for description of elimination of a discontinuity feeling at a low frequency due to cross fade processing.

Moreover, performing the cross fade processing as shown in FIG. 3 can eliminate an auditory discontinuity feeling in the low-frequency band, which accompanies the switching of the codec. In addition, also in the high-frequency band, the signal of the first codec does not suddenly disappear at the switching time point t2, and thus the occurrence of the abnormal sound can be suppressed. However, since a bandwidth feeling rapidly disappears, an auditory uncomfortable feeling still remains.

In a voice signal decoding method of the present exemplary embodiment, by adding noise signal NO gradually attenuating with time from the switching time point t2 to the high-frequency band where the signal component disappears due to the switching of the codec, the auditory uncomfortable feeling can be suppressed.

(2) Configuration

Figure 4:
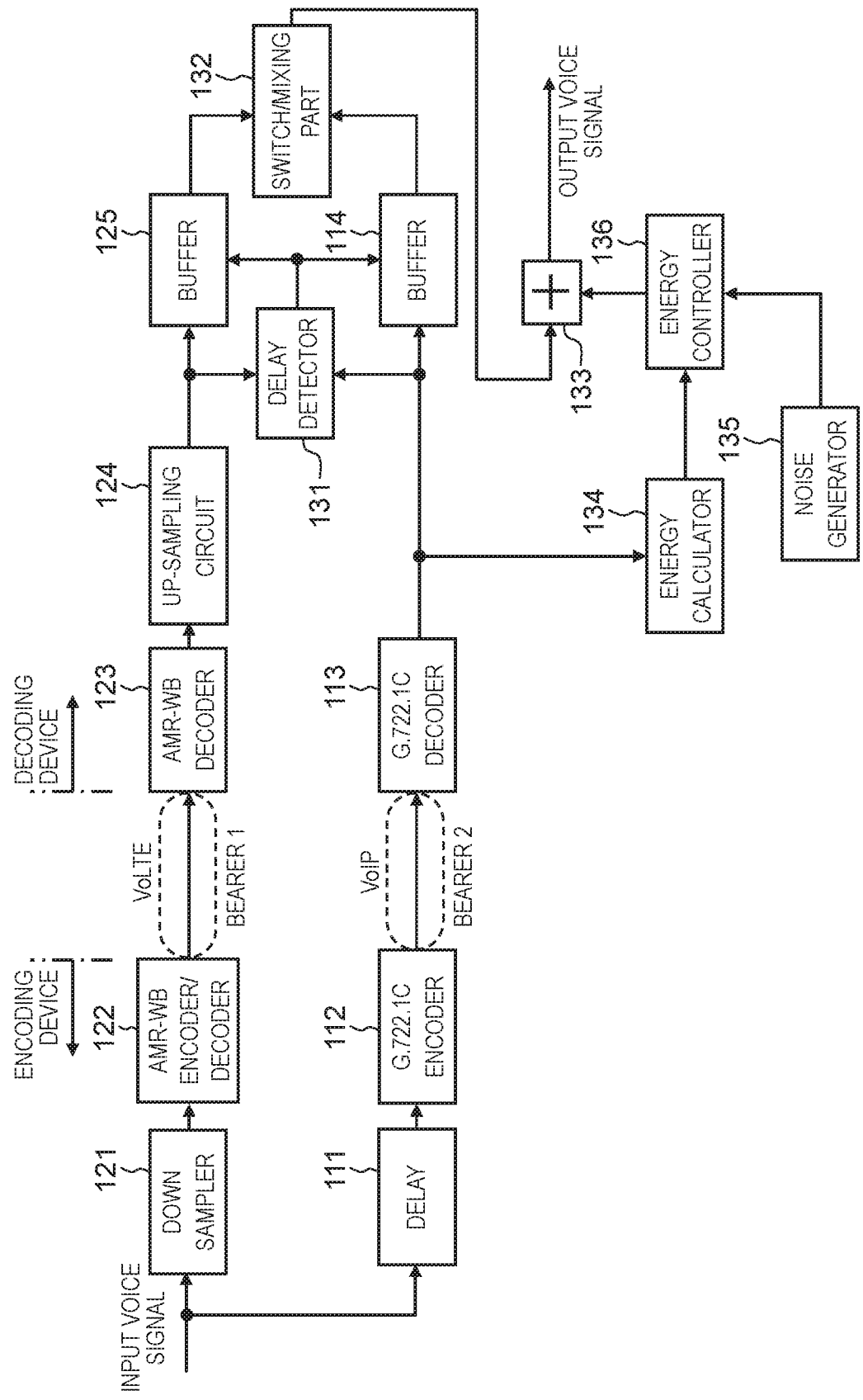
FIG. 4 is a block diagram showing a main configuration of a dual codec voice transmission system to which a voice signal decoding device of the exemplary embodiment is applied.

FIG. 4 is a block diagram showing a main configuration of a dual codec voice transmission system to which a voice signal decoding device of the present exemplary embodiment is applied.

An input voice signal of a sampling frequency Fs=32 kHz is encoded by down sampler 121 and AMR-WB encoder/decoder 122, by which the input voice signal is made a signal adapted to VoLTE (bearer 1) to be transmitted. On the other hand, the input voice signal is encoded by delay circuit 111 and G.722.1C encoder 112, by which the input voice signal is made a signal adapted to VoIP (bearer 2) to be transmitted.

The signal of VoLTE (bearer 1) is decoded by AMR-WB decoder 123 to be made an AMR-WB decoded signal, and is then inputted to buffer 125 and delay detector 131 through up-sampling circuit 124. On the other hand, the signal of VoIP (bearer 2) is decoded by G.722.1C decoder 113 to be made a G.722.1C decoded signal, and is then inputted to buffer 114, delay detector 131, and energy calculator 134.

Delay detector 131 detects a phase difference between the AMR-WB decoded signal and the G.722.1C decoded signal to output a detection result to buffers 125, 114. Buffers 125, 114 are controlled so that the phase difference between the AMR-WB decoded signal and the G.722.1C decoded signal is eliminated. Specifically, buffers 125, 114 shift the phase by delaying at least any one of the AMR-WB decoded signal and the G.722.1C decoded signal to perform phase correction. The AMR-WB decoded signal and the G.722.1C decoded signal synchronized by the above-described correction are inputted to switch/mixing part 132.

Switch/mixing part 132 switches an output signal in accordance with presence or absence of the signal or a signal quality in the G.722.1C decoded signal and the AMR-WB decoded signal. If the G.722.1C decoded signal, which has a quality higher than the AMR-WB decoded signal, is present, (i.e., the G.722.1C decoded signal is transmitted), switch/mixing part 132 selects and outputs the G.722.1C decoded signal. In contrast, if the G.722.1C decoded signal becomes absent (i.e., the transmission of the G.722.1C decoded signal is interrupted in some states of the transmission line), switch/mixing part 132 switches the output signal from the G.722.1C decoded signal to the AMR-WB decoded signal, as shown in FIG. 1.

In addition, when the output signal is switched from the G.722.1C decoded signal to the AMR-WB decoded signal, switch/mixing part 132 mixes both the signals in a frame immediately after the switching while both the signal are cross-faded, as shown in FIGS. 1 and 3. The output signal from switch/mixing part 132 is inputted to adder 133.

Energy calculator 134 calculates an energy of the G.722.1C decoded signal. Since in practice, the energy of the G.722.1C decoded signal varies, energy calculator 134 calculates a long-term average value of the energy over a plurality frames of the G.722.1C decoded signal.

Energy controller 136 adjusts an energy of the noise signal inputted from noise generator 135 in accordance with a calculation result of energy calculator 134 to output the adjusted energy to adder 133. This allows adder 133 to add the noise signal based on the long-term average value of the energy before the switching of the G.722.1C decoded signal to a signal disappearance portion at the high frequencies due to the switching of the G.722.1C decoded signal, as shown in FIG. 1. For example, it adds the noise signal having an energy proportional to a magnitude of the long-term average value of the energy. Moreover, an attenuation rate of the noise signal may be made smaller than the attenuation rate of the cross fade, by energy controller 136. In short, it adds the noise signal having the energy which does not allow the energy in the high frequencies of the G.722.1C decoded signal to rapidly vary at the timing of switching. Moreover, adding the noise signal having the energy matching the long-term average value of the energy, can reduce an auditory uncomfortable feeling, when the signal is again switched to the G.722.1C decoded signal several frames after the signal is switched to the AMR-WB decoded signal at the time point t2.

As described above, according to the present exemplary embodiment, when the output signal is switched from the G.722.1C decoded signal to the AMR-WB decoded signal having a band narrower than that of the G.722.1C decoded signal, the noise signal is added to the high-frequency band in the AMR-WB decoded signal, the high-frequency band lacking the signal component as compared with the G.722.1C decoded signal. This can realize the voice signal decoding device that can suppress the auditory uncomfortable feeling at the codec switching time.

Moreover, when the output signal is switched from the G.722.1C decoded signal to the AMR-WB decoded signal having the band narrower than that of the G.722.1C decoded signal, the G.722.1C decoded signal and the AMR-WB decoded signal are mixed while the G.722.1C decoded signal and the AMR-WB decoded signal are cross-faded, in the frame immediately after the switching. This can also suppress an auditory uncomfortable feeling in the low-frequency band.

Thus, the low-frequency component, to which continuity of the phase is auditorily important, is smoothly connected in a short time by the cross fade, and meanwhile, the high-frequency component, to which energy variation is auditorily important, is moderately attenuated for a long time by adding the noise signal. This can eliminate discontinuity of both the phase and the bandwidth feeling at the same time. Thereby, the dual codec voice transmission system in which arbitrary codecs are combined as a primary codec and a secondary codec can be constructed.

Figure 5:
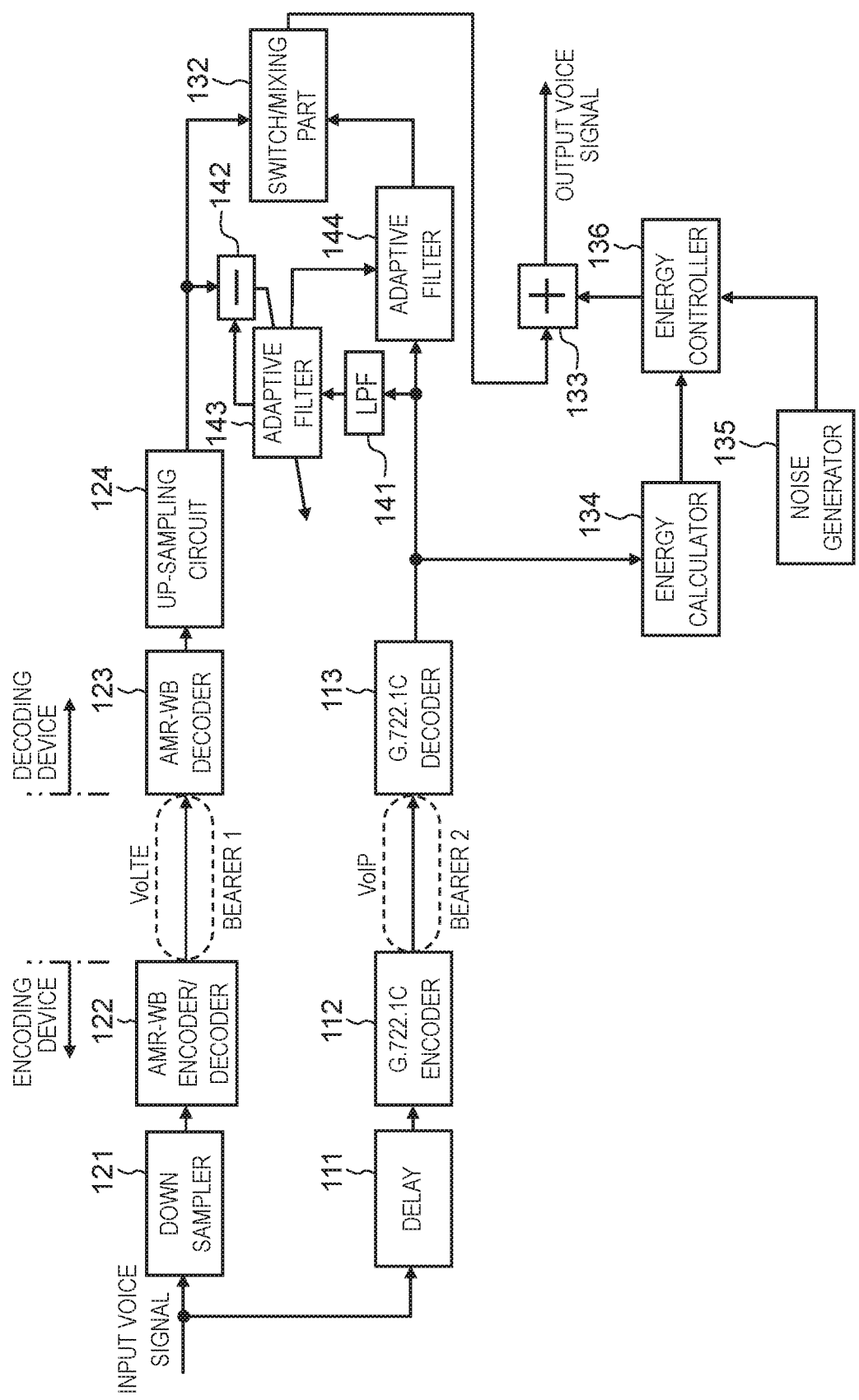
FIG. 5 is a block diagram showing a configuration of another exemplary embodiment.

While in the foregoing exemplary embodiment, as shown in FIG. 4, using delay detector 131 and buffers 114, 125, the phase correction between the AMR-WB decoded signal and the G.722.1C decoded signal is performed to thereby synchronize these signals, the configuration for synchronization is not limited thereto. For example, a configuration shown in FIG. 5 may be used. In FIG. 5 in which the same reference marks are given to portions corresponding to those in FIG. 4, adaptive filter 144 is used to implement the synchronization. The G.722.1C decoded signal is inputted to adaptive filter 143 through low pass filter (LPF) 141. Adaptive filter 143 finds a filter coefficient that brings an error signal inputted from difference circuit 142 to zero. Adaptive filter 144 filters the G.722.1C decoded signal, using the filter coefficient found in adaptive filter 143. This allows the G.722.1C decoded signal synchronized with the AMR-WB decoded signal to be outputted from adaptive filter 144. The configuration in FIG. 5 applies a principle of an echo filter.

Moreover, while in the foregoing exemplary embodiment, the case where the codec conforming with G.722.1C is used as the first codec and the codec conforming with AMR-WB is used as the second codec has been described, the first codec and the second codec are not limited thereto. In short, the voice signal decoding device and method of the present disclosure can be widely applied to a case where, in the dual codec voice transmission using the first codec having a wide band and the second codec having a band narrower than that of the first codec, the codec is switched from the first codec to the second codec.

While the foregoing exemplary embodiment describes the case where one aspect of the present disclosure is constructed of hardware as one example, the present disclosure can also be implemented by software in cooperation with hardware.

Moreover, the respective functional blocks used for the description of the foregoing exemplary embodiment are typically implemented as an LSI, which is an integrated circuit. The integrated circuit may control the respective functional blocks used for the description of the foregoing exemplary embodiment, and include input and output. These may be made individually into one chip, or may be made into one chip including a part or all thereof. While in this case, the term "LSI" is employed, the respective functional blocks may be referred to as an IC, a system LSI, a super LSI, or an ultra LSI, depending on an integration degree.

A method of implementing the integrated circuit is not limited to the LSI, and implementation by means of a dedicated circuit or a general-purpose processor may also be used. A field programmable gate array (FPGA) for which programming is possible after LSI fabrication, or a reconfigurable processor allowing reconfiguration of connections and settings of circuit cells inside the LSI may also be used.

Further, if a technology of an integrated circuit which is replaced with the LSI by another technology advanced or derived from a semiconductor technology appears, integration of the functional blocks may be naturally performed by using the technology. Application of biotechnology or the like can be made.

The foregoing embodiment is only one example for carrying out the present invention, and the technological scope of the present invention should not be interpreted to a limited extent due to this. That is, various modifications can be carried out without departing from the gist or principal feature of the present invention.

The voice signal decoding device of the present disclosure employs a configuration including a first decoder, a second decoder, a signal switch, and a noise adder. The first decoder decodes first encoded data encoded by a first encoding method and transmitted. The second decoder decodes second encoded data encoded by a second encoding method and transmitted. The second encoded data has a narrower band than a band of the first encoded data. The signal switch switches and outputs an output signal of the first decoder and an output signal of the second decoder. The noise adder adds a noise signal to a high-frequency band in the output signal of the second decoder when the signal switch switches the output signal from the output signal of the first decoder to the output signal of the second decoder. The high-frequency band is a band where a signal component is lacking as compared with the output signal of the first decoder.

Moreover, in the voice signal decoding device of the present disclosure, a configuration further including a mixing part may be employed. The mixing part mixes, when the signal switch switches the output signal from the output signal of the first decoder to the output signal of the second decoder, the output signal of the first decoder and the output signal of the second decoder while the output signal of the first decoder and the output signal of the second decoder are cross-faded, in a frame immediately after the switching.

Moreover, in the voice signal decoding device of the present disclosure, a configuration further including an energy calculator may be employed. The energy calculator calculates an average value of energies of the output signal of the first decoder over a plurality of frames. The noise adder may add the noise signal having an energy based on the average value calculated by the energy calculator.

Moreover, in the voice signal decoding device of the present disclosure, a configuration further including a phase corrector may be employed. The phase corrector perform phase correction by shifting a phase of at least one of the output signal of the first decoder and the output signal of the second decoder so that a phase difference between the output signal of the first decoder and the output signal of the second decoder is canceled out.

A voice signal decoding method of the present disclosure includes decoding first encoded data, decoding second encoded data, switching and outputting, and adding. In the decoding the first encoded data, first encoded data encoded by a first encoding method and transmitted is decoded. In the decoding the second encoded data, second encoded data encoded by a second encoding method and transmitted is decoded. The second encoded data has a narrower band than a band of the first encoded data. In the switching and outputting, a first decoded signal obtained in the decoding the first encoded data and a second decoded signal obtained in the decoding the second encoded data are switched and outputted. In the adding, a noise signal is added to a high-frequency band in the second decoded signal when the output signal is switched from the first decoded signal to the second decoded signal in the switching. The high-frequency band is a band where a signal component is lacking as compared with the first decoded signal.

INDUSTRIAL APPLICABILITY

A voice signal decoding device and a voice signal decoding method of the present disclosure are useful as a voice signal decoding device and a voice signal decoding method used in a dual codec voice transmission system using different codecs.

REFERENCE MARKS IN THE DRAWINGS

113: G.722.1C decoder (first decoder)
114, 125: buffer (phase corrector)
123: AMR-WB decoder (second decoder)
124: up-sampling circuit
131: delay detector
132: switch/mixing part (signal switch/mixing part)
133: adder (noise adder)
134: energy calculator
135: noise generator
136: energy controller
141: low pass filter (LPF)
142: difference circuit
143, 144: adaptive filter

The invention claimed is:

1. A voice signal decoding device, comprising:
a first decoder configured to decode first encoded data encoded by a first encoding method;
a second decoder configured to decode second encoded data encoded by a second encoding method, the second encoded data having a narrower band than a band of the first encoded data;
a signal switch configured to switch a first decoded signal obtained in the decoding the first encoded data and a second decoded signal obtained in the decoding the second encoded data; and
a noise adder configured to add a noise signal to a high-frequency band in an output signal of the second decoder, the high-frequency band being a band where a signal component is lacking as compared with an output signal of the first decoder,
wherein when the signal switch switches an output signal from the output signal of the first decoder to the output signal of the second decoder, the noise adder adds the noise signal to the high-frequency band in the output signal of the second decoder for a plurality of frames from a start time of switching, and
for one frame from the start time of the switching, the signal switch lowers the output signal of the first decoder gradually and raises the output signal of the second decoder gradually.

2. The voice signal decoding device according to claim 1, further comprising:
an energy calculator configured to calculate an average value of energies of the output signal of the first decoder over a plurality of frames,
wherein the noise adder adds the noise signal having an energy based on the average value calculated by the energy calculator.

3. The voice signal decoding device according to claim 1, further comprising:
a phase corrector configured to perform phase correction by shifting a phase of at least one of the output signal of the first decoder and the output signal of the second decoder so that a phase difference between the output signal of the first decoder and the output signal of the second decoder is canceled out.

4. A voice signal decoding method, comprising:
decoding first encoded data encoded by a first encoding method;
decoding second encoded data encoded by a second encoding method, the second encoded data having a narrower band than a band of the first encoded data;
switching a first decoded signal obtained in the decoding the first encoded data and a second decoded signal obtained in the decoding the second encoded data; and
adding a noise signal to a high-frequency band in the second decoded signal, the high-frequency band being a band where a signal component is lacking as compared with the first decoded signal,
wherein when switching an output signal from the first decoded signal to the second decoded signal, the noise signal to the high-frequency band in the second decoded signal is added for a plurality of frames from a start time of switching, and
for one frame from the start time of the switching, the first decoded signal is lowered gradually and the second decoded signal is raised gradually.

* * * * *